United States Patent
Camarda et al.

(10) Patent No.: US 9,989,716 B2
(45) Date of Patent: Jun. 5, 2018

(54) FEEDTHROUGH ASSEMBLY AND METHOD OF ASSEMBLING A FEEDTHROUGH ASSEMBLY

(71) Applicant: LGS Innovations LLC, Herndon, VA (US)

(72) Inventors: Renato M. Camarda, Fanwood, NJ (US); Alfonso B. Piccirilli, Green Brook, NJ (US)

(73) Assignee: LGS INNOVATIONS LLC, Herndon, VA (US)

( * ) Notice: Subject to any disclaimer, the term of this patent is extended or adjusted under 35 U.S.C. 154(b) by 6 days.

(21) Appl. No.: 15/609,548

(22) Filed: May 31, 2017

(65) Prior Publication Data

US 2017/0261709 A1    Sep. 14, 2017

Related U.S. Application Data

(62) Division of application No. 14/843,410, filed on Sep. 2, 2015, now Pat. No. 9,696,505.

(51) Int. Cl.
| | |
|---|---|
| *G02B 6/46* | (2006.01) |
| *G02B 6/44* | (2006.01) |
| *G02B 6/42* | (2006.01) |
| *H02G 3/22* | (2006.01) |
| *H05K 5/06* | (2006.01) |

(52) U.S. Cl.
CPC ......... *G02B 6/4248* (2013.01); *G02B 6/4251* (2013.01); *H02G 3/22* (2013.01); *H05K 5/06* (2013.01)

(58) Field of Classification Search
CPC .................................................. G02B 6/4428
See application file for complete search history.

(56) References Cited

U.S. PATENT DOCUMENTS

| | | | |
|---|---|---|---|
| 3,951,515 A | 4/1976 | Allard | |
| 4,082,421 A | 4/1978 | Auracher et al. | |
| 4,214,809 A | 7/1980 | Reh | |
| 4,432,603 A | 2/1984 | Morency et al. | |
| 4,625,073 A * | 11/1986 | Breesch | B29C 61/0608 |
| | | | 156/49 |
| 5,561,273 A | 10/1996 | Yamanashi | |
| 6,389,214 B1 | 5/2002 | Smith et al. | |
| 6,445,869 B1 | 9/2002 | Tanner | |
| 6,466,725 B2 | 10/2002 | Battey et al. | |
| 7,083,334 B2 * | 8/2006 | Camporeale | G02B 6/3861 |
| | | | 385/80 |

(Continued)

FOREIGN PATENT DOCUMENTS

| | | | | |
|---|---|---|---|---|
| EP | 0325006 B1 * | 7/1993 | ........... | G02B 6/4428 |
| GB | 19861 | 6/1906 | | |
| GB | 2273398 A * | 6/1994 | ................ | F16L 5/14 |

*Primary Examiner* — Michelle R Connelly
(74) *Attorney, Agent, or Firm* — Baker & Hostetler LLP

(57) ABSTRACT

The present application describes a signal conveying system including plural cables and a feedthrough assembly. The feedthrough assembly includes a main housing. The assembly also includes at least one housing positioned within the main housing with an internal wall that defines a plurality of conduits. The assembly also includes a volume defined by an internal surface of the main housing. The assembly further includes a sealing material provided in the volume. The application also describes a method of conveying optical signals.

8 Claims, 9 Drawing Sheets

(56) References Cited

U.S. PATENT DOCUMENTS

| | | | |
|---|---|---|---|
| 7,354,202 B1 | 4/2008 | Luger | |
| 7,664,363 B1* | 2/2010 | Mowery, Sr. | G02B 6/3887 |
| | | | 385/137 |
| 7,918,612 B1 | 4/2011 | Zhao et al. | |
| 8,367,931 B2 | 2/2013 | Emerson et al. | |
| 8,550,721 B2 | 10/2013 | Ringgenberg et al. | |
| 8,873,926 B2 | 10/2014 | Beamon et al. | |
| 2003/0099453 A1 | 5/2003 | Moidu et al. | |
| 2003/0152356 A1 | 8/2003 | Fritz et al. | |
| 2004/0144555 A1* | 7/2004 | Buekers | G02B 6/4444 |
| | | | 174/653 |
| 2010/0303431 A1 | 12/2010 | Cox et al. | |
| 2011/0014807 A1 | 1/2011 | Ries et al. | |
| 2012/0051710 A1 | 3/2012 | Zeng et al. | |
| 2013/0014974 A1* | 1/2013 | Burke | G02B 6/4444 |
| | | | 174/135 |
| 2013/0043069 A1 | 2/2013 | Okuyama | |

* cited by examiner

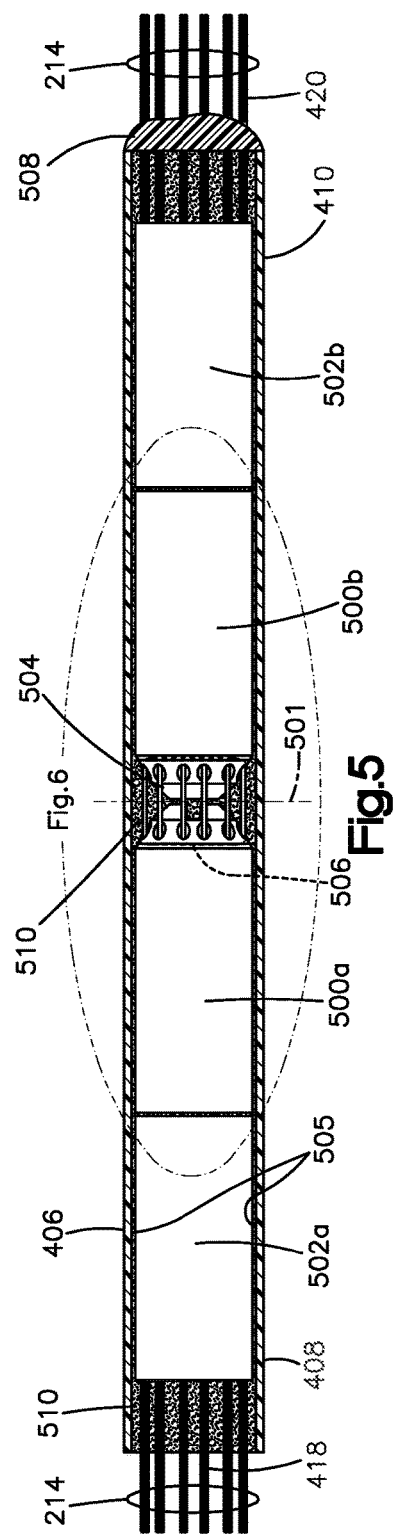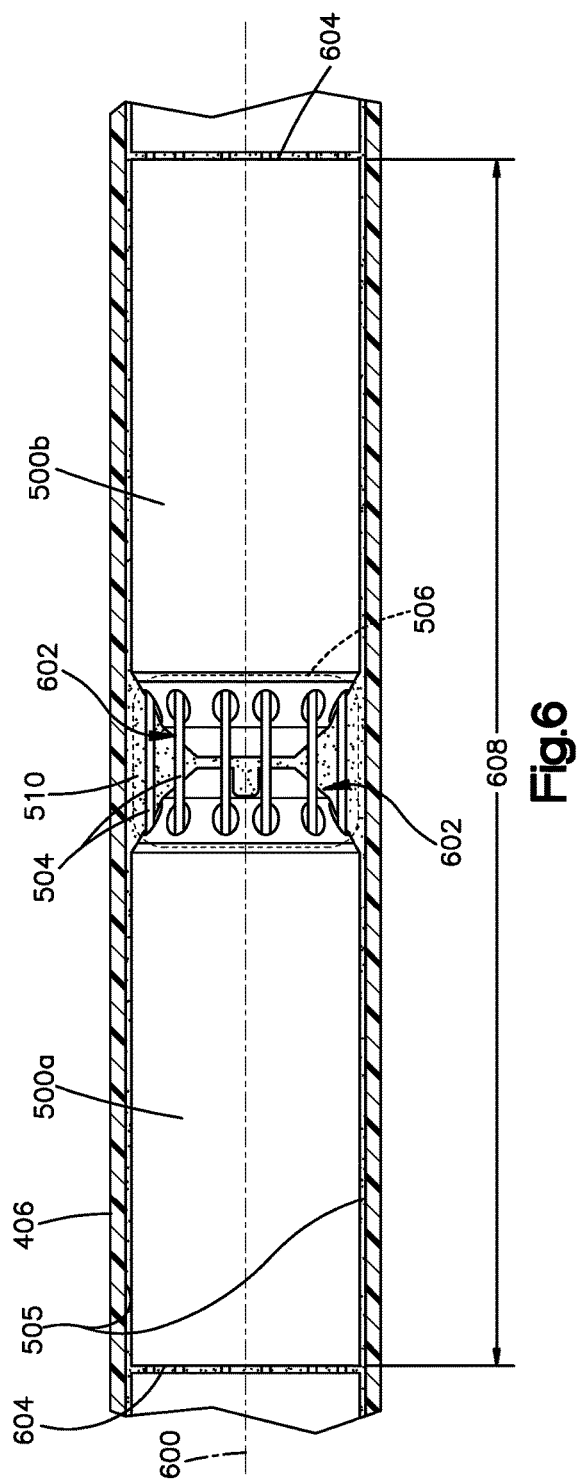

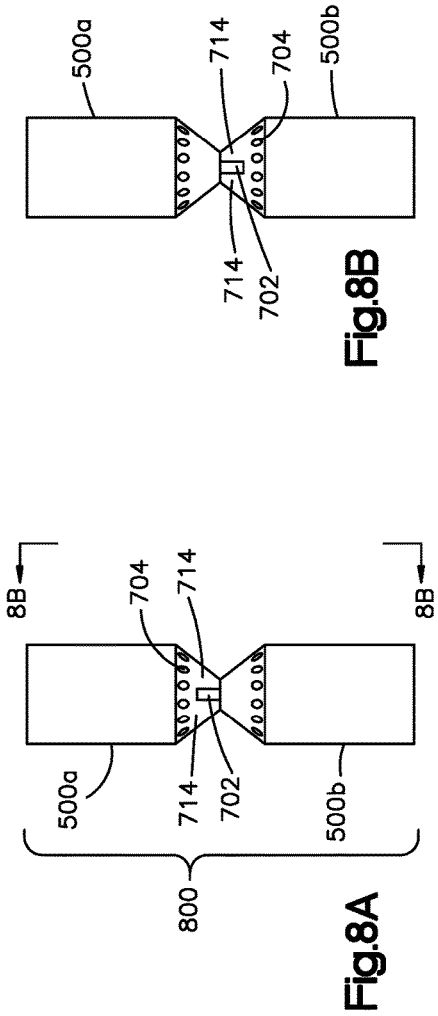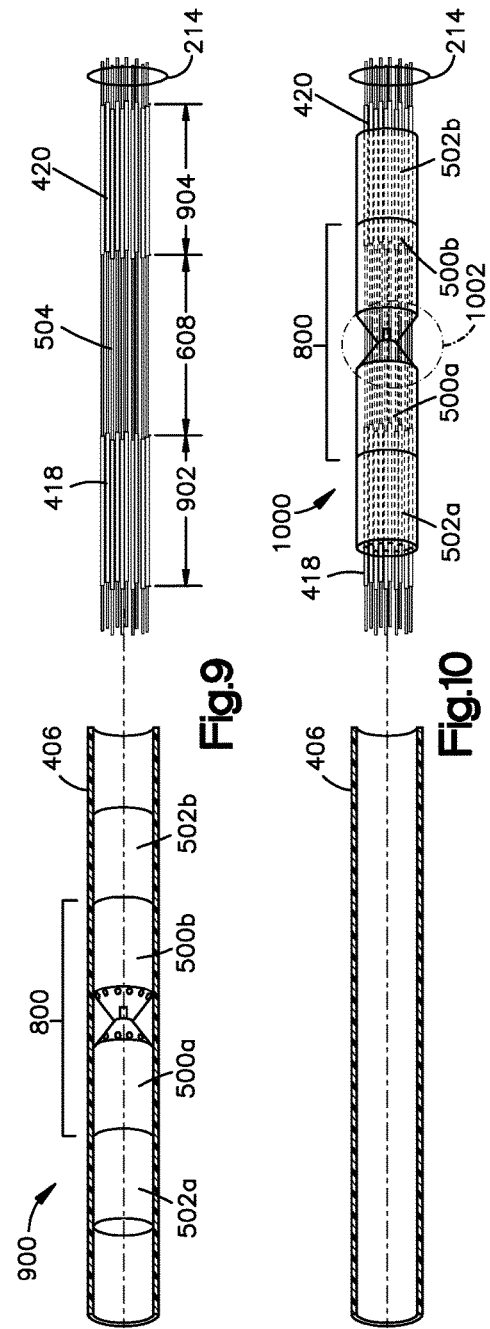

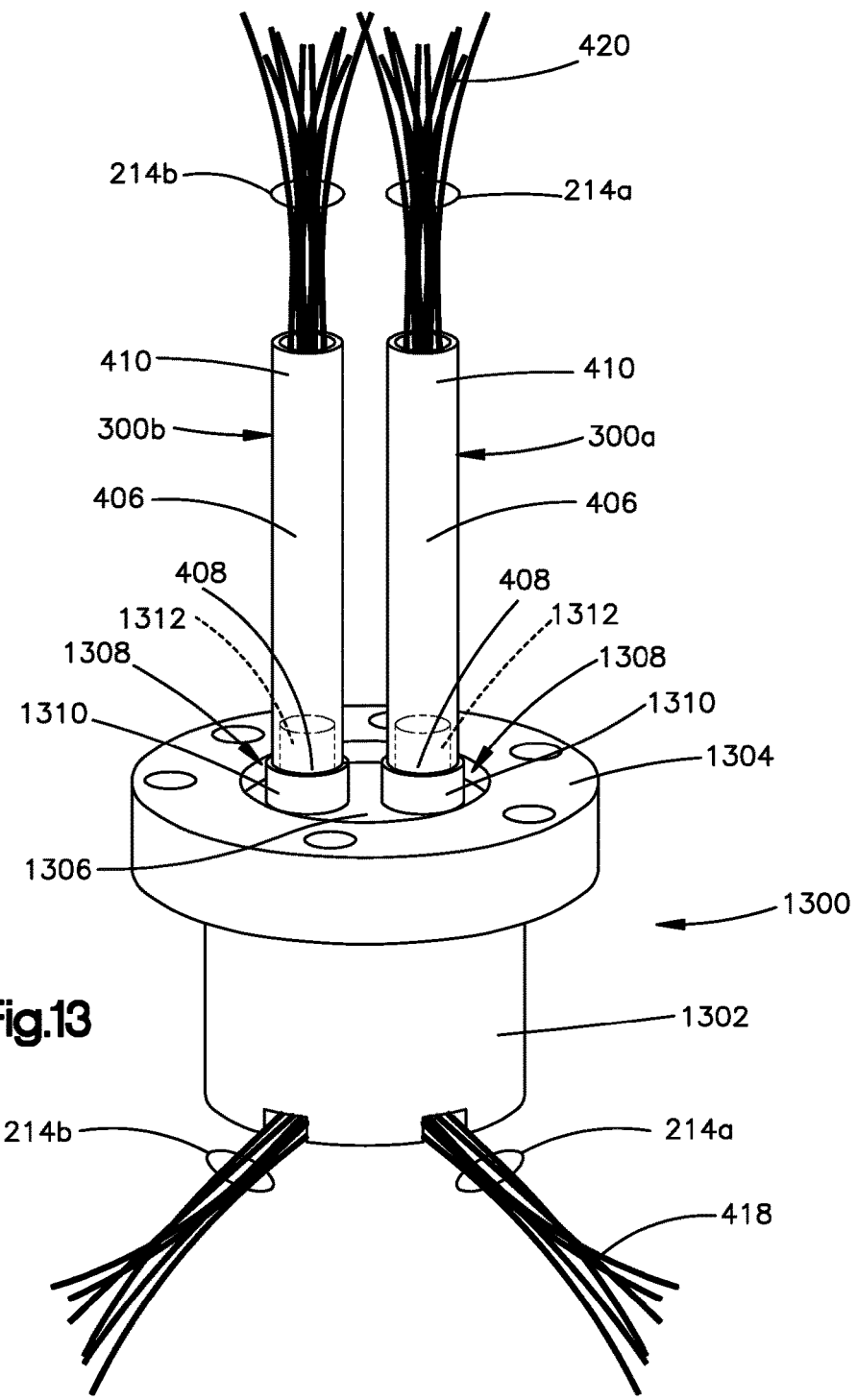

FEEDTHROUGH ASSEMBLY AND METHOD OF ASSEMBLING A FEEDTHROUGH ASSEMBLY

CROSS-REFERENCE TO RELATED APPLICATIONS

This application is a Divisional of U.S. application Ser. No. 14/843,410 filed Sep. 2, 2015, entitled "Feedthrough Assembly and Method of Assembling a Feedthrough Assembly" the contents of which is incorporated by reference in its entirety.

TECHNICAL FIELD

The present disclosure relates generally to feedthrough assemblies, and more particularly, to a feedthrough assembly through which optical or electrical signals are transmitted in cables that extend through the feedthrough assembly. Further, the present disclosure relates generally to feedthrough assemblies in which may be housed, cables of various types, such as optical fiber cables, electrical cables, or any other type of cable through which an optical, electrical, thermal, or fluid signal may be transmitted.

BACKGROUND

Component testing, such as optical component testing, often requires transmitting an electrical or optical power signal to a component and measuring an output of the component. In order to determine how the component will perform in particular environments, for example a space or high temperature environment, the component is tested in a chamber under low or vacuum pressure. The test may evaluate whether the component is susceptible to an operational irregularity that is thermally induced.

Generally, electrical or optical power signals are transmitted with a cable from a non-vacuum environment through a feedthrough and to the component in the vacuum environment. To ensure there is no loss of vacuum pressure, the cable must be hermetically sealed through the feedthrough. In an arrangement including multiple cables extending through the feedthrough, heat may be generated in each cable as a respective signal is transmitted. A thermal path is needed for each cable to remove heat. This prevents thermally induced operational irregularities from occurring in a testing system device.

In addition, axial and lateral stress on cables due to bends or generally non-linear sections within the feedthrough lead to signal loss and/or cable failure. This is particularly evident in the case of cables transmitting optical signals, and more specifically high-power optical signals. Accordingly, there is a need for each cable in an arrangement of multiple cables to extend, and be maintained to extend, along a straight path through the feedthrough.

SUMMARY

According to an aspect of the present disclosure, a feedthrough assembly is described which includes a main housing, a first inner housing positioned within the main housing and defining a plurality of first inner conduits, a second inner housing positioned within the main housing and defining a plurality of second inner conduits, and a chamber defined by an internal surface of the main housing, a first end of the first inner housing, and a first end of the second inner housing that faces the first end of the first inner housing. Each of the plurality of first inner conduits is aligned with a corresponding one of the plurality of second inner conduits. A cross-sectional area of the chamber varies along a longitudinal axis of the main housing.

According to another aspect of the present disclosure, a signal conveying system includes a base, a cover defining a chamber with the base, a feedthrough assembly mounted to the base, and a plurality of cables extending through the feedthrough assembly into the chamber and configured to transmit signals. The feedthrough assembly includes a main housing, at least one housing positioned within the main housing and including an internal wall that defines a plurality of conduits, a volume defined by an internal surface of the main housing, and at least one sealing material provided at least throughout the volume. Each cable extends through the main housing and a respective conduit along a respective continuous axis. In addition, the sealing material and the internal wall isolate each cable from a respective remainder of the plurality of cables.

Another aspect of the present disclosure provides a method of assembling a feedthrough assembly including providing a first and a second housing each including plural conduits there through, aligning each conduit of the first housing with a respective conduit of the second housing to form aligned conduit pairs, passing at least two optical fiber cables through separate conduit pairs, and supplying a sealing material into the separate conduit pairs through a central conduit of at least one of the first housing and the second housing.

Yet another aspect of the present disclosure provides a method of testing a component in a testing system including a feedthrough assembly having a housing defining a plurality of conduits and an optical fiber cable extending through each conduit. The method includes providing at least one optical signal to the feedthrough assembly, transmitting the optical signal through a straight path from a first end to a second end of the feedthrough assembly, and transmitting the optical signal from the second end to the component and measuring an output of the component. The straight path is defined by at least one optical fiber cable in direct contact with a sealing material that fills the feedthrough assembly and maintains each optical fiber cable to extend along a respective straight path within the feedthrough assembly.

BRIEF DESCRIPTION OF THE DRAWINGS

FIG. 5 illustrates a partial view of a feedthrough assembly, according to an aspect of the present disclosure.

FIG. 6 illustrates an enlarged portion of FIG. 5, identified as Detail 6.

FIG. 8A illustrates a schematic elevation view of an inner housing arrangement, according to an aspect of the present disclosure.

FIG. 8B illustrates a schematic elevation view of the inner housing arrangement of FIG. 8A, taken from line 8B-8B.

FIG. 9 illustrates a schematic partial view of a housing assembly, according to an aspect of the present disclosure.

FIG. 10 illustrates a schematic isometric view of a cable and housing assembly, according to an aspect of the present disclosure.

FIG. 13 illustrates a fixture constructing a feedthrough assembly, according to an aspect of the present disclosure.

DETAILED DESCRIPTION

Aspects of the disclosure will now be described in detail with reference to the drawings, wherein like reference numbers refer to like elements throughout, unless specified otherwise.

It is noted that as used in the specification and the appending claims the singular forms "a," "an," and "the" can include plural references unless the context clearly dictates otherwise.

Unless specified otherwise, the terms "substantial" or "substantially" as used herein mean "considerable in extent," or "largely but not necessarily wholly that which is specified."

Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context.

Figure 1:
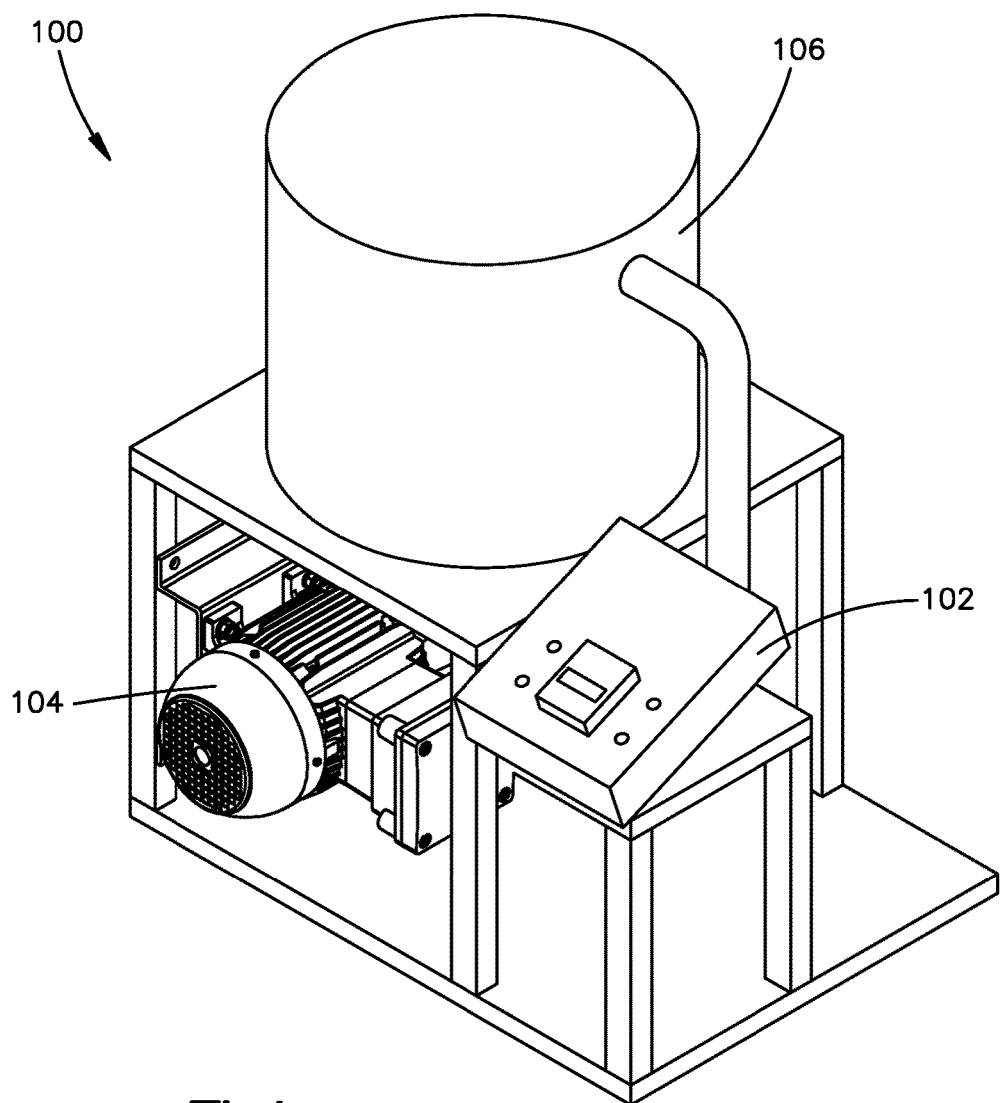
FIG. 1 illustrates a perspective view of a test testing system, according to an aspect of the present disclosure.

FIG. 1 illustrates a perspective view of a test testing system 100, according to an aspect of the present disclosure. The testing system 100 includes a controller 102 that operates at least one pump 104. The pump 104 is operatively connected to a cover 106.

Figure 2:
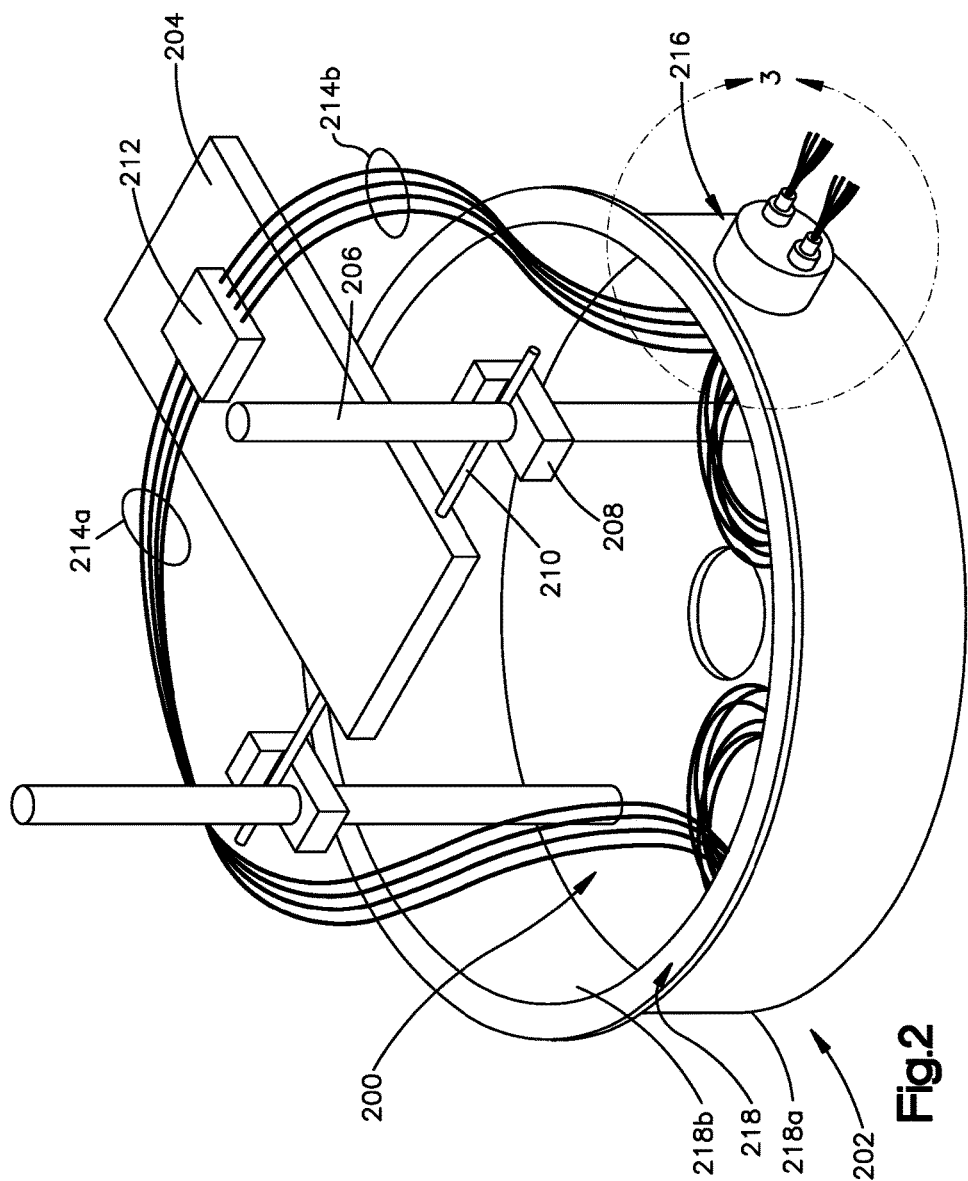
FIG. 2 illustrates a perspective view of a testing chamber, according to an aspect of the present disclosure.

FIG. 2 illustrates a perspective view of a testing chamber 200, according to an aspect of the present disclosure. The testing chamber 200 is defined by an interior of the cover 106 and a base 202. The pump 104 may apply a vacuum pressure through the cover 106 to the testing chamber 200 to form a vacuum. Alternatively, the pump may pressurize the testing chamber 200 in order for the testing chamber 200 to be at a different pressure than a pressure outside of the cover 106. A platform 204 is positioned within the testing chamber 200 by first mounting rods 206. The first mounting rods 206 extend vertically within the testing chamber 200 and include rod holders 208 that receive second mounting rods 210 extending in a horizontal direction from the platform 204. A component 212 may be positioned on top of the platform 204 and receive signals through input cables 214a and either output or transmit signals through output cables 214b. The input cables 214a and the output cables 214b may extend from an area outside of the testing chamber 200 (e.g. an area under atmospheric pressure) into the testing chamber 200 through a flange assembly 216 extending from an outer surface 218a of a wall 218 of the base 202. An inner surface 218b of the wall 218 defines a bottom portion of the testing chamber 200.

Figure 3:
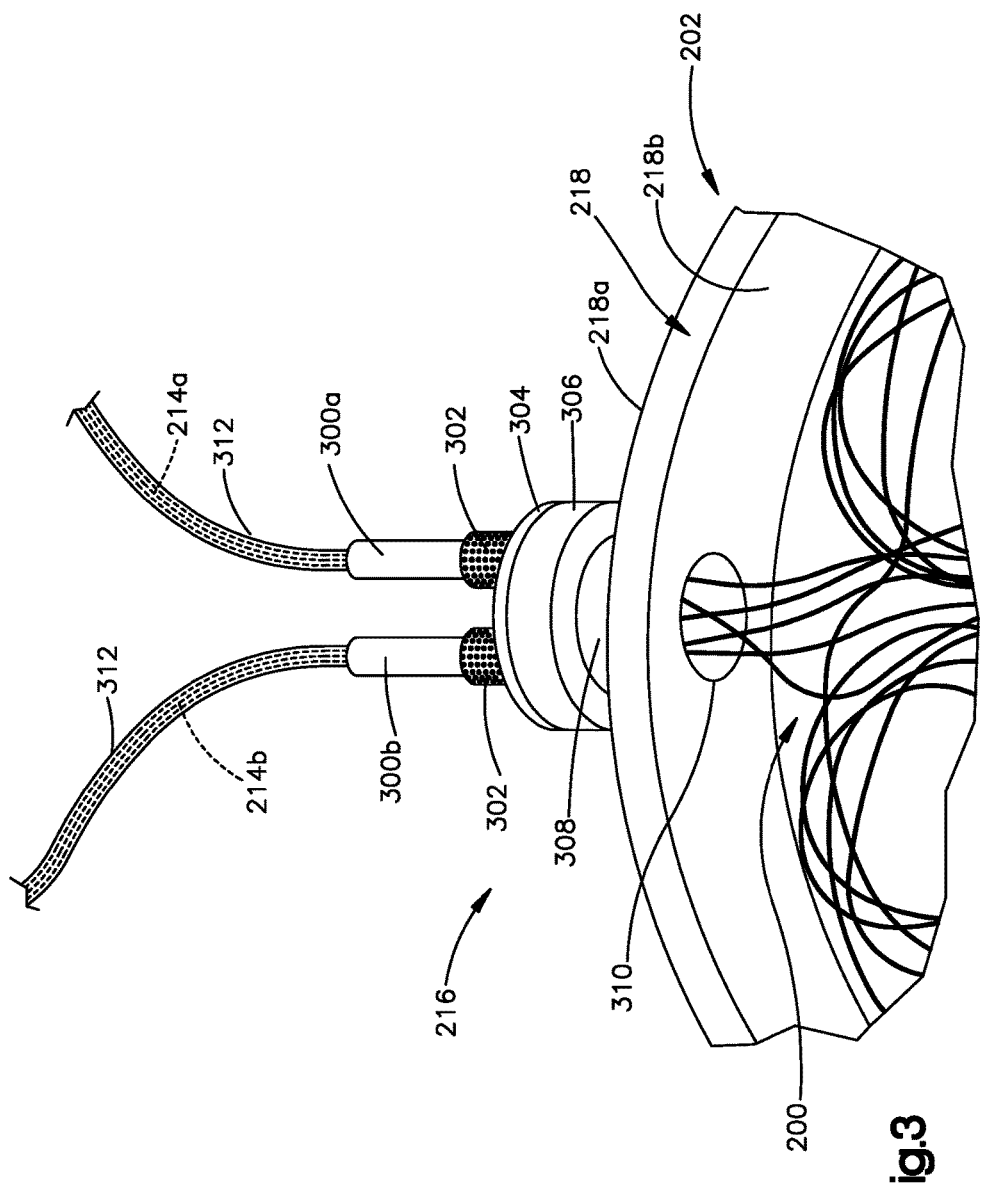
FIG. 3 illustrates a top view of an enlarged portion of FIG. 2, identified as Detail 3.

FIG. 3 illustrates a top view of an enlarged portion of FIG. 2, identified as Detail 3. As illustrated in FIG. 3, a first feedthrough assembly 300a and a second feedthrough assembly 300b may be secured to the flange assembly 216 by respective fastening collars 302. In particular, each of the fastening collars 302 may be coupled with an O-ring to couple a respective one of the first feedthrough assembly 300a and the second feedthrough assembly 300b to a mating flange 304 of the flange assembly 216, and thereby create a seal between the testing chamber 200 and each of the feedthrough assemblies (300a, 300b). Each of the fastening collars 302 may be a threaded fastener, such as a neural nut or other fastening device. The fastening collars 302 allow the feedthrough assemblies (300a, 300b) to be detached from the flange assembly 216 without a requirement that the mating flange 304 or a mounting flange 306 of the flange assembly 216 be replaced. The mounting flange 306 is attached to the mating flange 304 by a plurality of nuts and bolts or other fastening mechanisms known in the art (e.g. adhesives, clamps, screws, etc.). The mounting flange 306 is positioned at the end of a duct 308 which extends from a location on the outer surface 218a of the wall 218 corresponding to a location of a bore 310 that opens on the inner surface 218b to the test chamber 200. The input cables 214a may be housed in a respective cable bundle conduit 312, and extend through the first feedthrough assembly 300a, the mating flange 304, the mounting flange 306, and the bore 310, and into the testing chamber 200. Similarly, the output cables 214b may be housed in a respective cable bundle conduit 312, and extend through the second feedthrough assembly 300b, the mating flange 304, the mounting flange 306, and the bore 310, and into the testing chamber 200.

Figure 4:
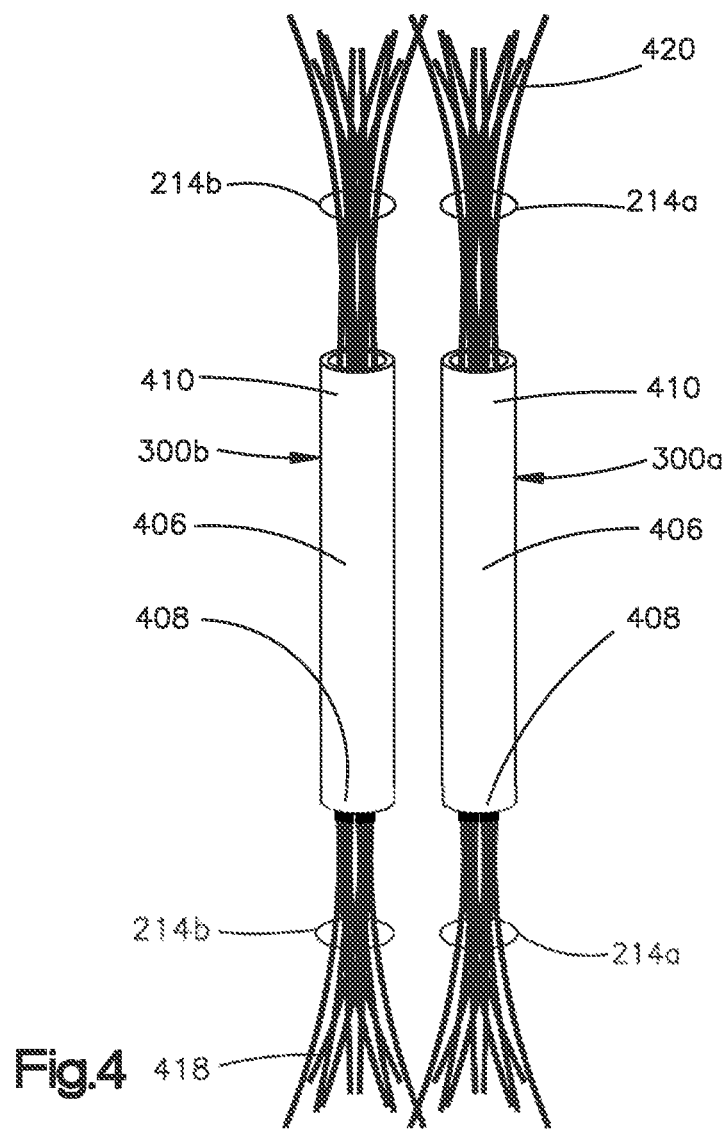
FIG. 4 illustrates a front elevation view of the first feedthrough assembly and the second feedthrough assembly of FIG. 3.

FIG. 4 illustrates a front elevation view of the first feedthrough assembly 300a and the second feedthrough assembly 300b. A main housing 406 of each of the first feedthrough assembly 300a and the second feedthrough assembly 300b may extend from a first end 408 to a second end 410. A portion of each input cable 214a and each output cable 214b extending from the first end 408 of a respective main housing 406 includes a first sleeve 418. A portion of each input cable 214a and each output cable 214b extending from a second end 410 of a respective main housing 406 includes a second sleeve 420. The first sleeve 418 and the second sleeve 420 may each be formed from a polymer material having optical, heat, or electrical insulating characteristics. The first sleeve 418 and the second sleeve 420 may be formed from the same or different materials. For example, the first sleeve 418 may be formed from a material suitable for exposure to a vacuum pressure, and the second sleeve 420 may be formed from a material suitable for exposure to atmospheric pressure.

The first end 408 of each of the first feedthrough assembly 300a and the second feedthrough assembly 300b is configured to be attached to the mating flange 304 with respective fastening collars 302 illustrated in FIG. 3. As explained in more detail below, the first end 408 of each of the feedthrough assemblies (300a, 300b) will be sealed by a material that is suitable for maintaining a sealed connection while being subjected to vacuum pressure during an operation of the testing system 100 illustrated in FIG. 1. Further, as explained in more detail below, the material used to seal the first ends 408 may be different than a material used to seal respective second ends 410 of the feedthrough assemblies (300a, 300b). In order to aid an operator or technician that is coupling one of the feedthrough assemblies (300a, 300b) to the flange assembly 216, the first sleeve 418 may be a different color than the second sleeve 420. Thus, the operator or technician may be able to easily recognize the color of the sleeve that corresponds to the end of one the feedthrough assemblies (300a, 300b) that is to be coupled to the mating flange 304 of the flange assembly 216.

FIG. 5 illustrates a partial view of a feedthrough assembly 300, according to an aspect of the present disclosure. The feedthrough assembly 300 is an exemplary embodiment of the first feedthrough assembly 300a and the second feedthrough assembly 300b, and includes a respective main housing 406 through which respective cables 214 extend. Within the main housing 406, a first inner housing 500a and a first outer housing 502a may be positioned on one side of a center 501 of the main housing 406 closer to the first end 408. As illustrated in FIG. 5, a second inner housing 500b and a second outer housing 502b may also be positioned within the main housing 406 on the other side of the center 501, closer to the second end 410. It will be appreciated that the housings (500a, 500b, 502a, 502b) may be positioned in other arrangements relative to the center 501 of the main housing 406. Each cable 214 extends through each of the housings (500a, 500b, 502a, 502b).

A cable core 504 of each cable 214 extends through a feedthrough chamber 506 that is defined by the first inner housing 500a, the second inner housing 500b, and an inner surface 505 of the main housing 406. The cable core 504 may be a core of an optical fiber which may be made of glass, or more generally, made of optically transparent fusion products of inorganic materials that have been cooled to a rigid state without crystallizing. Alternatively, the cable core 504 may be formed from an electrically conductive material, such as copper. In the case of an optical fiber, each cable core 504 will have an index of refraction for light transmission, and each cable 214 may include a layer of cladding separating a respective cable core 504 from a respective first sleeve 418 and a respective second sleeve 420. The cladding may have an index of refraction that is lower than the index of refraction of the cable core 504.

A first sealing material 508 may be provided at the second end 410 of the main housing 406 surrounding portions of the cables 214 including second sleeves 214. The first sealing material 508 may be fast setting epoxy or resin suitable for exposure to atmospheric pressures. A second sealing material 510 may be provided to fill the feedthrough chamber 506. The second sealing material 510 may be a thermally conductive adhesive material such as a low vapor pressure epoxy or resin. In addition, the second sealing material 510 may surround, and as described in more detail below, fill the first inner housing 500a, the first outer housing 502a, the second inner housing 500b, and the second outer housing 502b. In addition, the second sealing material 510 may surround each of the cables 214 at the first end 408 of the main housing 406.

FIG. 6 illustrates an enlarged portion of FIG. 5, identified as Detail 6. As illustrated in FIG. 6, a cross-sectional area of the feedthrough chamber 506 varies along a longitudinal axis 600 of the main housing 406 according to a shape of a first end 602 of the first inner housing 500a and a shape of a first end 602 of the second inner housing 500b. The first end 602 of the first inner housing 500a may be tapered and face the first end 602 of the second inner housing 500b, and a second end 604 of the first housing 500a may have a planar shape and extend along a plane perpendicular to the longitudinal axis 600. Similarly, the first end 602 of the second inner housing 500a may be tapered and face the first end 602 of the first inner housing 500b, and a second end 604 of the second inner housing 500a may have a planar shape and extend along a plane perpendicular to the longitudinal axis 600. Thus, the cross-sectional area of the feedthrough chamber 506 may increase in a direction from the first inner housing 500a towards the center 501 of the main housing 406, and continuing in the same direction, decrease from the center 501 towards the second inner housing 500b.

A portion of the cable core 504 of each cable 214 extends through at least a portion of the first inner housing 500a, the feedthrough chamber 506, and at least a portion of the second inner 500b without a respective cladding, first sleeve 418, and second sleeve 420 over an exposed core cable length 608. An exposed core cable length 608 may be the same for each cable 214, and may extend from the second end 604 of the first inner housing 500a to the second end 604 of the second inner housing 500b. For each cable 214, a respective cable core 504 is immediately surrounded by the second sealing material 510 across an entire length of the feedthrough chamber 506.

Figure 7A:
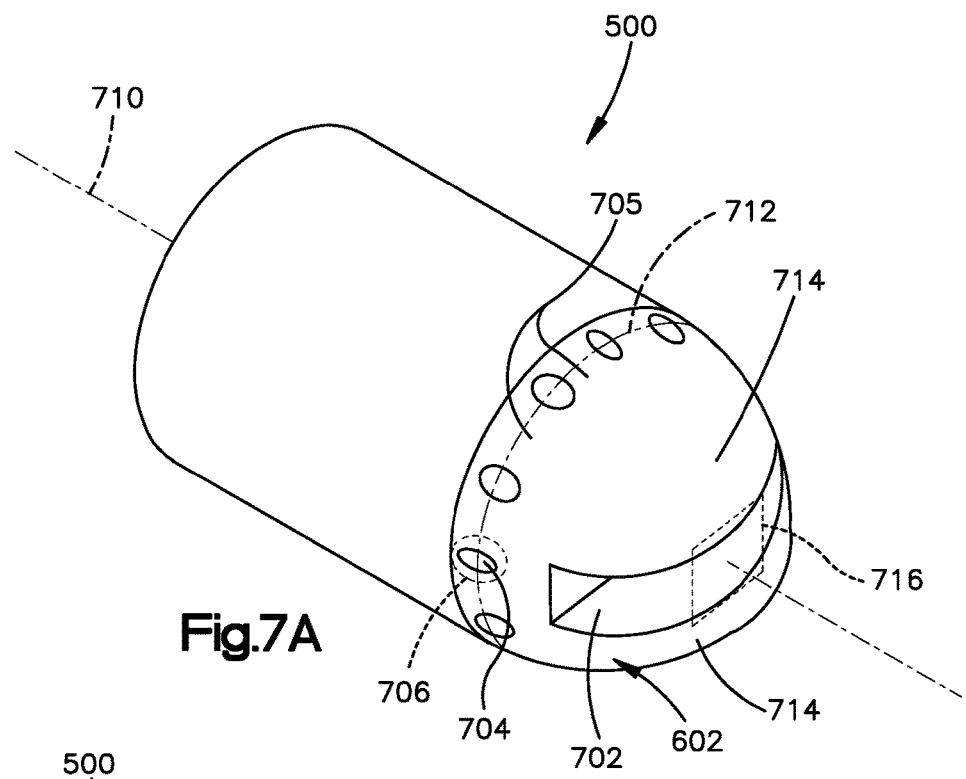
FIG. 7A illustrates a front perspective view of an inner housing, according to an aspect of the present disclosure.
Figure 7B:
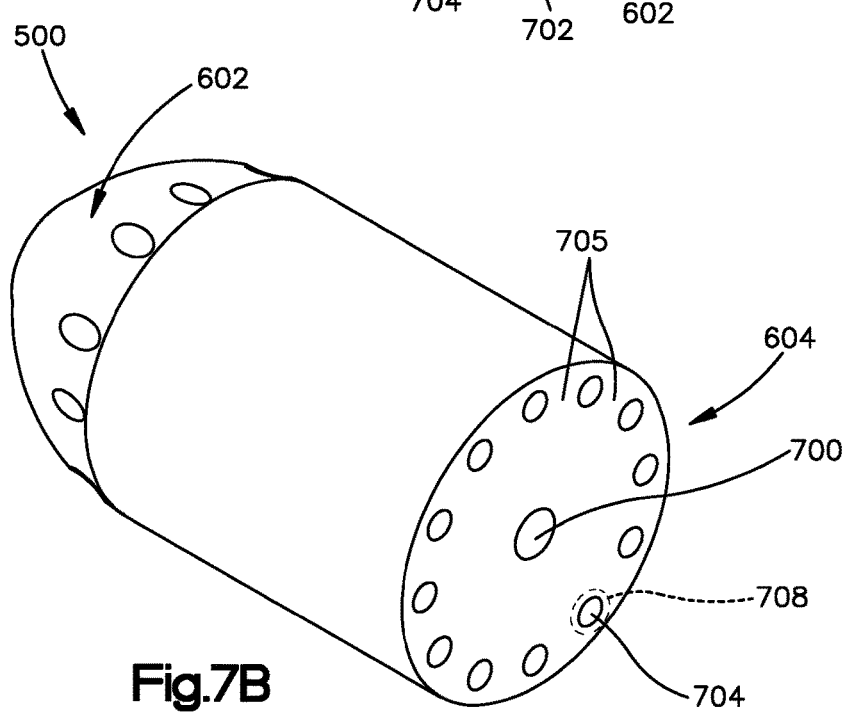
FIG. 7B illustrates a rear perspective view of the inner housing of FIG. 7A.

FIG. 7A illustrates a front perspective view of an inner housing 500, according to an aspect of the present disclosure. The inner housing 500 is an exemplary embodiment of the first inner housing 500a and the second inner housing 500b, and includes a respective first end 602 and a respective second end 604. FIG. 7B illustrates a rear perspective view of the inner housing 500 of FIG. 7A. As illustrated in FIGS. 7A and 7B, an inner central conduit 700 is defined within the inner housing 500 to extend from a slot 702 in the first end 602, to a planar through hole 703 in the second end 604. A plurality of inner cable conduits 704 are defined by an internal wall 705 of the inner housing 500, and extend from angled through-holes 706 formed in the first end 602 as illustrated in FIG. 7A, to planar through holes 708 formed in the second end 604 of the inner housing 500 as illustrated in FIG. 7B. A width (e.g. diameter) of each inner cable conduit 704 may be sized to accommodate the cable core 504 of a respective cable 214, or a combination of the cable core 504, cladding, and either of the first sleeve 418 or the second sleeve 420 of the respective cable 214.

The inner cable conduits 704 are evenly spaced in an annular direction about a longitudinal axis 710 of the inner housing 500. Thus, the inner cable conduits 704 are arranged in a row 712 of conduits extending from the first end 602. In particular, each inner cable conduit extends from a same axial position along, and is positioned a same radial distance from the longitudinal axis 710 of the inner housing 500. It will be appreciated that the inner housing 500 may include multiple rows of the inner cable conduits 704, with each row spaced a respective radial distance from the longitudinal axis 710. In an arrangement with multiple rows 712, spacing in the annular direction between inner cable conduits 704 could be the same for each row 712. Accordingly, rows 712 closer to the longitudinal axis 710 in a radial direction will have fewer inner cable conduits 704 than rows 712 further from the longitudinal axis 710. Alternatively, within each row 712, inner cable conduits 704 may be spaced in the annular direction so that each row 712 has the same number of inner cable conduits 704. It will be appreciated that the inner cable conduits 704 may be provided in multiple arrangements, including arrangements of inner cable conduits 704 that are not equally spaced in the annular direction and/or arranged in rows.

As illustrated in FIG. 7A, the slot 702 extends across an entire width of the inner housing 500 between flanks 714 which are tapered along the longitudinal axis 710 and define as least a portion of a tapered shape of the first end 602. It will be appreciated that the flanks 714 may be formed as rounded or flat tapered surfaces, and an angle of a taper for each flank 714 may be constant, increasing, or decreasing in a direction from the first end 602 towards the second end 604. A length of the slot 702 along the longitudinal axis 710 of the inner housing 500 may correspond to a length of a tapered portion of the first end 602. It will be appreciated that the length of the slot 702 in other configurations may increase or decrease along the width of the inner housing 500 from an edge of the inner central conduit 700 (e.g. a surface defining an end of the slot 702 opposite to an open end may be angled along the width of the inner housing 500). As illustrated in FIG. 7A, a leading edge 716 of the inner housing 500 is open such that a portion of the slot 702 corresponding to the inner central conduit 700 is not blocked from an area in front of the first end 602 of the inner housing 500. Alternatively, the inner housing 500 may include a thin layer (not shown) extending between the flanks 714 for a portion of the length of the slot 702 corresponding to the leading edge 716. A width of the thin layer may be equal to a width (e.g. diameter) of the inner central conduit 700.

During a filling process, described in more detail below, the second sealing material 510 is supplied to the feedthrough assembly 300. The slot 702 of the first inner housing 500a provides an outlet through which the second material 510 may be supplied to the feedthrough chamber 506. The second sealing material 510 may be conveyed through the slot 702 of the first inner housing 500a and diverted by the flanks 714 of the second housing 500b so as to be dispersed throughout the feedthrough chamber 506. The second sealing material 510 may also flow into the slot 702 of the second housing 500b.

FIG. 8A illustrates a schematic elevation view of an inner housing arrangement 800, according to an aspect of the present disclosure. The inner housing arrangement 800 includes the first inner housing 500a and the second inner housing 500b illustrated in FIGS. 5 and 6. A slot 702 is defined between flanks 714 of the first inner housing 500.

FIG. 8B illustrates a schematic elevation view of the inner housing arrangement 800 of FIG. 8A, taken from line 8B-8B. A slot 702 is defined between flanks 714 of the second inner housing 500b. The second inner housing 500b is positioned relative to the first housing 500a so that the flanks 714 of the second inner housing 500b extend along a plane that is perpendicular to a plane of the flanks 714 of the first housing 500a. More specifically, the second housing 500b is rotated so the flanks 714 of the second inner housing 500b are offset by 90° relative to the flanks 714 of the first housing 500a. It will be appreciated that an angle of offset may be an angle other than 90°, such that the flanks 714 of the second inner housing 500b divert and distribute the second sealing material 510 being supplied sufficiently to fill any space within the feedthrough assembly 300 that is not occupied by the cables 214 or the housings (500a, 500b, 502a, 502b).

In the inner housing arrangement 800, each inner cable conduit 704 of the first inner housing 500a is paired with a corresponding inner cable conduit 704 of the second housing 500b. Each pair of inner cable conduits 704 are aligned such that one of the cables 214 can extend through a respective pair of inner cable conduits 704 along a straight path. As described in more detail below with reference to FIGS. 11 and 12, each of the first outer housing 502a and the second outer housing 502b may include outer cable conduits 1104 which are aligned, respectively, with the inner cable conduits 704 of the first inner housing 500a and the second inner housing 500b. Thus, each cable 214 extends through the feedthrough assembly 300 along a respective straight path.

FIG. 9 illustrates a schematic partial view of a housing assembly 900, according to an aspect of the present disclosure. The housing assembly 900 includes the main housing 406, the inner housing arrangement 800, and the first outer housing 502a and the second outer housing 502b on opposite sides of the inner housing arrangement 800. The feedthrough chamber 506 is entirely defined within the housing assembly 900.

The housings (500a, 500b, 502a, 502b) may be secured in the main housing 406 by an adhesive material. For example, the housings (500a, 500b, 502a, 502b) may be coated with an adhesive material and inserted into the main housing 406; and the main housing 406 may remain in a stationary position while the adhesive material is allowed to set. The adhesive material may be the same material as the second sealing material 510, or any other type of thermally conductive adhesive material. According to another aspect of the present disclosure, each of the housings (500a, 500b, 502a, 502b) may be formed from a material that is capable of being deformed to a relative degree, and shaped to include an outermost diameter substantially the same as a diameter of the inner surface 505 of the main housing 406. Upon insertion into the main housing 406, the housings (500a, 500b, 502a, 502b) may be compressed to a degree for which a shape and alignment of the cable conduits (704, 1104) are substantially maintained, and secured via an interference fit with the inner surface 505 in the main housing 406.

Prior to inserting the housings (500a, 500b, 502a, 502b) in the main housing 406, the first inner housing 500a may be rotated relative to the second housing 500b so that the flanks 714 of the first housing 500a are perpendicular to the flank 714 of the second inner housing 500b, or offset by a desired angle, to provide the inner housing arrangement 800. In addition, at least one rigid wire or cable may be passed through a pair of inner cable conduits 704 and corresponding outer cable conduits 1104 (FIGS. 11 and 12), to align the cable conduits (704, 1104) before the housings (500a, 500b, 502a, 502b) are inserted into the main housing 406. In the case of an interference fit, a rigid wire or cable may be passed through more than one pair of inner cable conduits 704 and corresponding outer cable conduits 1104.

Alternatively, each of the housings (500a, 500b, 502a, 502b) can be formed with and additional conduit that is only used to receive a wire for alignment purposes. The additional conduit would not accommodate a cable 214, but would be later filled with the second sealing material 510 after the wire is removed. According to another aspect of the present disclosure, the first inner housing 500a may include a notch or recess formed in a respective flank(s), which corresponds to a register or other type of protrusion formed in a respective flank(s) of the second inner housing 500b. Accordingly, when the first inner housing 500a is properly aligned with the second inner housing 500b, the register or protrusion will be received in the notch or recess. It will be appreciated that each of the inner housings (500a, 500b) may have a notch and a protrusion formed on respective flanks. According to yet another aspect of the present disclosure, the inner housing arrangement 800 could be formed as a single housing with slots 702 arranged in the manner illustrated in FIGS. 5, 6, 8A, and 8B. Thus, a need to align the first inner housing 500a relative to the second inner housing 500b before inserting the inner housing arrangement 800 into the main housing 406 can be obviated, and the inner housings (500a, 500b) will remain aligned during an assembly process.

Once the housing assembly 900 is constructed the cables 214 may be inserted into the housing assembly 900. Each cable 214 includes the exposed core cable length 608, a first sleeve cable length 902 including the first sleeve 418 surrounding the cladding and the core 504, and a second sleeve cable length 904 including the second sleeve 420 surrounding the cladding and the core 504. The cables 214 may be inserted into the housing assembly 900 with the sleeves (418, 420), or the sleeves (418, 420) can be slid over the cables 214 after the cables 214 are inserted. For each cable 214, the first sleeve cable length 902 may be positioned at least within the first outer housing 502a, and the second sleeve cable length 904 may be positioned at least within the second outer housing 502b. According to one aspect of the present disclosure a portion of each first sleeve cable length 902 may be positioned in a respective inner cable conduit 704 of the first inner housing 500a, and a portion of each second sleeve cable length 902 may be positioned in a respective inner cable conduit 704 of the second inner housing 500b. According to another aspect of the present disclosure, a portion of each exposed core cable length 608 may be positioned in the first outer housing 502a and the second outer housing 502b.

FIG. 10 illustrates a schematic isometric view of a cable and housing assembly 1000, according to an aspect of the present disclosure. The cable and housing assembly 1000 includes the cables 214, the first inner housing 500a, the first outer housing 502a, the second inner housing 500b, and the second outer housing 502b. The cable and housing assembly 1000 defines an internal frame 1002 of the feedthrough chamber 506 with the first ends 602 of the first inner housing 500a and the second inner housing 500b. The cables 214 may be positioned in the housings (500a, 500b, 502a, 502b) after the pairs of inner cable conduits 704 and corresponding outer cable conduits 1104 (FIGS. 11 and 12) are aligned to provide the inner housing arrangement 800, and before the cable and housing assembly 1000 is inserted within the main housing 406. For each cable 214, a portion of the first sleeve cable length 902 may be positioned at least within the first outer housing 502a, and a portion of the second sleeve cable length 904 may be positioned at least within the second outer housing 502b. In order to minimize the number of components that may rotate during insertion, a thermally conductive adhesive may be applied between the first inner housing 500a and the first outer 500b, and between the second inner housing 500b and the second outer housing 502, prior to the cable and housing assembly 1000 being inserted into the main housing 406.

Figure 11:
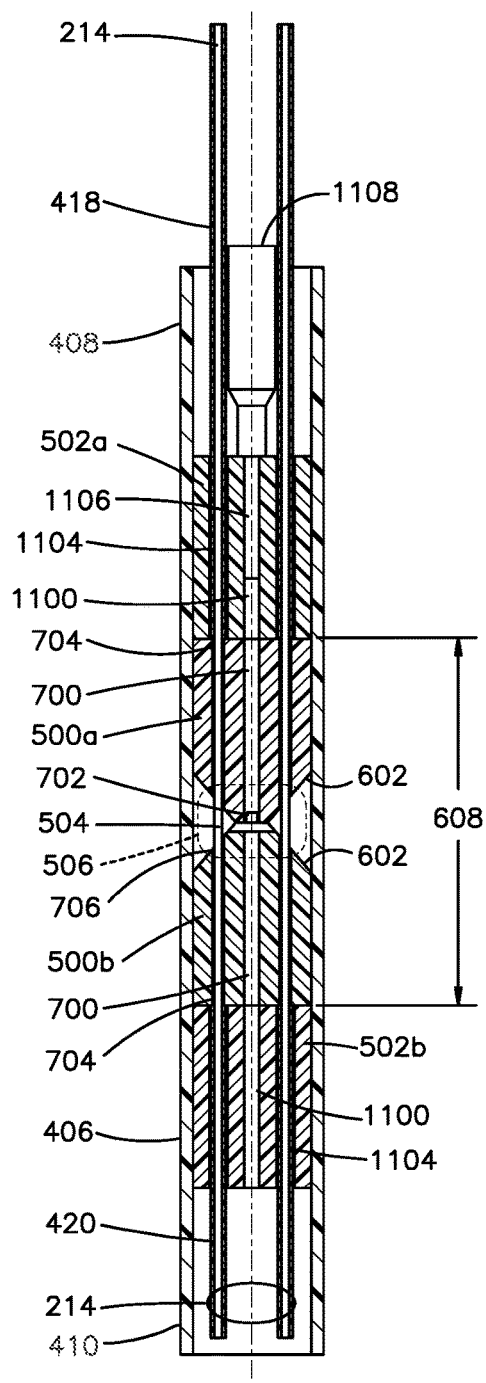
FIG. 11 illustrates a schematic cross-sectional view of the feedthrough assembly of FIG. 5.

FIG. 11 illustrates a schematic cross-sectional view of the feedthrough assembly 300 of FIG. 5. In particular, the feedthrough assembly 300 is shown prior to being filled with the second sealing material 510. As illustrated in FIG. 11, an outer central conduit 1100 is defined by the first outer housing 502a and is in fluid communication with the inner central conduit 700 of the first inner housing 500a, and an outer central conduit 1100 of the second outer housing 502b is in fluid communication with the inner central conduit 700 of the second inner housing 500b. The first outer housing 502a includes outer cable conduits 1104 that are in alignment with the inner cable conduits 704 of the first inner housing 500a, the inner cable conduits 704 of the second inner housing 500b, and outer cable conduits 1104 of the second outer housing 502b. At least a portion of each cable 214 within a respective outer cable conduit 1104 of the first outer housing 502a includes the first sleeve 418, and at least a portion of each cable 214 within a respective outer cable conduit 1104 of the second outer housing 502b includes the second sleeve 420. As illustrated in FIG. 11, the central conduits (700, 1100) are coaxial with the longitudinal axis 600 of the feedthrough assembly 300.

Figure 12:
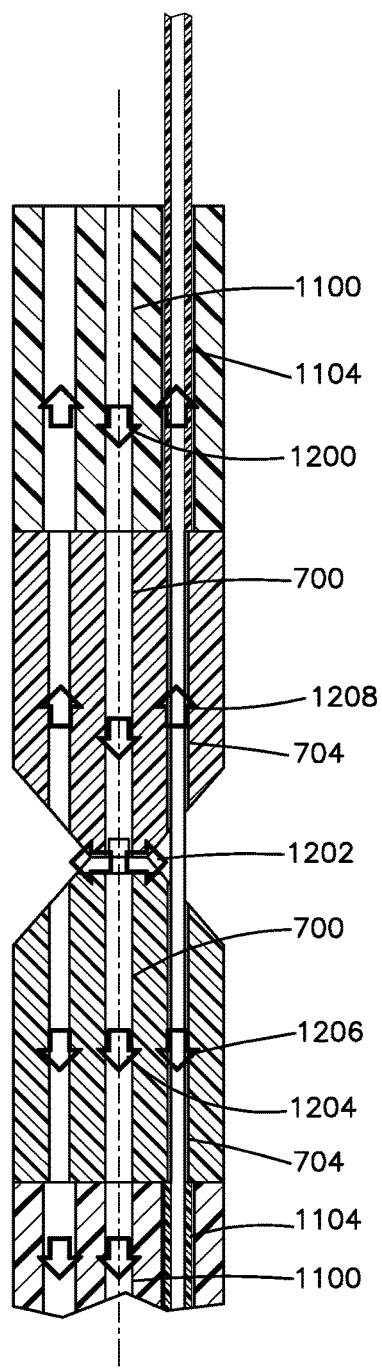
FIG. 12 illustrates flow paths through the feedthrough assembly as illustrated in FIG.

According to one aspect of the present disclosure, the diameter of the outer cable conduits 1104 may be sized according to a diameter of the portions of the cables 214 with the first sleeves 418 or the second sleeves 420, and the diameter of the inner cable conduits 704 may be sized according to a diameter of the cable core 504. In particular, as illustrated in FIGS. 11 and 12, the outer cable conduits 1104 may have a larger diameter than a diameter of the inner cable conduits 704. For example, a diameter of the outer cable conduits 1104 can be two times the size of a diameter of the inner cable conduit 704. During assembly, the first sleeve 418 and the second sleeve 420 can be removed from each of the cables 214 before the cables are inserted into the housings (500a, 500b, 502a, 502b). Once inserted, the first sleeve 418 and the second sleeve 420 of each cable 214 can be slid over a respective end of the cable core 504 of a respective cable 214. A radial portion of each outer cable conduit 1104 will overlap with a portion of the internal wall 705 surrounding the smaller diameter inner cable conduits 704 at the second ends 604 of the first inner housing 500a and the second inner housing 500b. As such, when the first sleeves 418 and second sleeves 420 are slid over the cable cores 504 and into the outer cable conduits 1104 of the first outer housing 502a and the second outer housing 502b, the progress of each sleeve will be stopped by the internal walls 705 of the first inner housing 500a and second inner housing 500b. Alternatively, the outer cable conduits 1104 may be defined to have a diameter the same as a diameter of the inner cable conduits 704.

According to another aspect of the present disclosure, the diameter of the outer cable conduits 1104 may be sized relative to the diameter of the inner cable conduits 704 to promote a flow of the second sealing material 510 during the filling process of the feedthrough assembly 300, and a completeness of filling the spaces around the cables 214 within the cable conduits (704, 1104). According to one aspect of present disclosure, where multiple rows 714 of the inner cable conduits 704 and corresponding rows of outer cable conduits 1104 are provided, diameters of cable conduits (704, 1104) in one row may be different from diameters of the cable conduits (704, 1104) in another row in order to accommodate different sized cables 214.

During the filling process, an outlet 1106 of a fluid delivery device 1108 is inserted into an end of the first outer housing 502a facing the first end 408 of the main housing 406. The outlet 1106 may be a needle or other type of conduit having a diameter substantially the same as, or less than, the diameter of the outer central conduit 1100 of the first outer housing 502b. The fluid delivery device 1108 may include a syringe or nozzle operatively attached to the outlet 1106.

FIG. 12 illustrates flow paths (1200, 1202, 1204, 1206, 1208) through the feedthrough assembly 300 as illustrated in FIG. 11. During an initial step of the filling process for the feedthrough assembly 300, the first sealing material 508 (not shown) is supplied to the second end 410 of the main housing 406 and allowed to set in order to provide a plug which stops the second sealing material 510 from flowing out of the second end 410 of the main housing 406. During the time when the first sealing material 508 is supplied, the feedthrough assembly 300 may be orientated 180° from an orientation shown in FIG. 11 so that the second end 410 of the main housing 406 faces in an upward direction.

After the first sealing material 508 sets, the feedthrough assembly 300 may be rotated 180°. Next, the fluid delivery device 1108 may be attached or inserted into the outer central conduit 1100 of the first outer housing 502a, and the second sealing material 510 may be supplied through the outlet 1106. The sealing material 510 may flow along a first flow path 1200 defined by the outer and inner central conduits (700, 1100) of the first outer and inner housings (502a, 500a). Next, the sealing material 510 may flow through a second flow path 1202 defined by the slot 702, in a direction perpendicular to a direction of flow through the first flow path 1200. The second sealing material 510 may flow along the second flow path 1202 into the feedthrough chamber 506. The second sealing material 510 may flow along a third flow path 1204 defined by the inner and outer central conduits (700, 1100) of the second inner and outer housings (500b, 502b) until being stopped by the first sealing material 508. The second sealing material 510 will accumulate and fill the third flow path 1204, while at the same time, being diverted by the flanks 714 of the second inner housing 500b into fourth flow paths 1206 defined by the inner and outer cable conduits (704, 1104) of the second inner and outer housings (500b, 502b).

According to one aspect of the present disclosure, some of the second material 510 may flow through the third flow path 1204 and fill a space (not shown) between the first sealing material 508 and an end of the second outer housing 502 that faces the second end 410 of the main housing 406, more rapidly than the second sealing material 510 flowing in the fourth flow paths 1206. Accordingly, the fourth flow paths 1206 may begin to be filled in a direction from the space between the first sealing material 508 and the second outer housing 502b towards the feedthrough chamber 506. Alternatively, in a case where the first inner housing 500a is provided with a thin layer (not shown) extending between the flanks 714 of the first inner housing 500a as previously discussed, more of the flow of the second material 510 may be diverted by the flanks 714 of the second inner housing 500b into the angled through holes 706 of the second inner housing 500b and into the fourth flow paths 1206. Accordingly, the fourth flow paths 1206 may fill more rapidly than the third flow path 1204, and the third flow path 1204 may begin to be filled in the direction from the space between the first sealing material 508 and the second outer housing 502b towards the feedthrough chamber 506.

During, or after, the time the second sealing material 510 fills the third and fourth flow paths (1204, 1206), the feedthrough chamber 506 and fifth flow paths 1208 defined by the inner and outer cable conduits (704, 1104) of the first inner and outer housings (500a, 502a), may be filled with the second sealing material 510. In the feedthrough chamber 506, the cable cores 504 of the cables are completely surrounded by, and thus in direct contact with, the second sealing material 510.

Once the filling process is complete, between the first end 408 of the main housing 406 and the first sealing material 510, each cable 214 is completely surrounded by the second sealing material 510. Accordingly, any space between walls defining the inner and outer cable conduits (704, 1104) and the cables 214, whether it be the cable cores 504 or portions of each cable 214 including the first sleeve 418 or the second sleeve 420, is completely filled with the second sealing material 510. In addition, any space between the inner surface 501 of the main housing 406 and outer surfaces of the housings (500a, 500b, 502a, 502b) is also filled with the second sealing material 510. Thus, each cable 214 may be hermetically sealed, and there may be substantially no pockets of air, within the main housing 406 of the feedthrough assembly 300. As described in more detail below, the distribution of second sealing material 510 eliminating pockets of air and hermetically sealing each cable 214, coupled with the isolation of each cable 214 by encapsulating each cable 214 with the thermally conductive second sealing material 510, may be advantageous for an application of the feedthrough assembly 300 incorporating optical fiber cables. However, it will be understood that the cables 214 may be any type of cable that can transmit an electrical, optical, thermal, or fluid signal.

FIG. 13 illustrates a fixture 1300 for constructing a feedthrough assembly, according to an aspect of the present disclosure. A base 1302 of the fixture 1300 is attached to a mounting structure 1304 formed with a recess 1306. At least one standoff 1308 extends from the recess 1306. The standoff 1308 may include a large diameter portion 1310 and a small diameter portion 1312 extending from the large diameter portion 1310. A diameter of the small diameter portion 1312 is less than an inner diameter of the main housing 406. Each standoff 1308 may be formed as a single component that is part of the mounting structure 1304 of the fixture 1300, or as a separate component that can be detachably fixed to a surface of the recess 1306 in the mounting structure 1304. In the case of the latter, each standoff 1308 can be replaced with another standoff having large and small diameter portions different than the standoff 1308 that is being replaced, in order to accommodate housings of different sizes.

FIG. 13 illustrates a portion of a construction of, for example, the first feedthrough assembly 300a before the first sealing material 508 is applied to the second end 410. It will be appreciated that the following procedure for constructing the first feedthrough assembly 300a may be applied to construct the second feedthrough assembly 300b. The first feedthrough assembly 300a is positioned on top of a respective standoff 1308 and the cables 214a extend out of the base 1302. The small diameter portion 1312 of the standoff 1308 is positioned inside of the first end 408. Accordingly, during construction, the small diameter portion 1312 supports and maintains the housings (500a, 500b, 502a, 502b) together in a desired location within the main housing 406. Thus, the fixture 1300 holds the first feedthrough assembly 300a in place during a time when the first sealing material 508 is applied to the second end 410 and allowed to set. Following the setting of the first sealing material 508, the first feedthrough assembly 300a is taken off of the standoff 1308 and rotated 180° so that the outlet 1106 of the fluid delivery device 1108 can be inserted into the central conduit 1100 as illustrated in FIG. 11, and the second sealing material 510 can be supplied. According to an aspect of the present disclosure, the standoff 1308 may be received in and removed from a second recess within the mounting structure 1304. During construction, the first feed through assembly 300a may be positioned in the second recess and held in place thereby as the second sealing material 510 flows through the flow paths (1200, 1202, 1204, 1208).

Low pressure testing may be used to evaluate optical component performance in space based systems, or to exacerbate the conditions an optical component will be exposed to in a high-temperature environment. In particular, in a low pressure testing environment, such as a vacuum environment, convection may be eliminated as a method for heat removal and therefore increase a probability and effect of operational irregularities that are thermally induced. In addition, where optical fibers are implemented in testing applications, bends or generally non-linear sections of the optical fiber cables, especially sections where cores of the optical fiber cables are not surrounded by cladding or sleeves, may be subject to axial stress that can lead to failure and positional orientations increasing optical signal loss through the optical fiber cable.

According to one aspect of the present disclosure, the component 212 illustrated in FIG. 2, may be an optical component that may be incorporated in, for example, a space based system. The pump 104 of the testing system 100 illustrated in FIG. 1, may apply a vacuum pressure to the testing chamber 200 in order to test the optical performance of the component 212 under conditions the component 212 may be subject to. The input cables 214a and the output cables 214b of FIG. 2 may be optical fiber cables. For each feedthrough assembly (300a, 300b), the cable conduits (704, 1104) coupled with the second sealing material 510, hermetically seal each optical fiber cable within the main housing 406. The hermetic seal provided around each optical fiber cable, and a seal of the main housing 406 provided by the combination of the first sealing material 508 and the second sealing material 510, maintains the testing chamber 104 under a vacuum or low pressure, as opposed to, for example, an atmospheric pressure outside of the cover 106.

During operation, substantial amounts of heat can be generated in each optical fiber cable core as a respective optical signal is conveyed through the optical fiber cable core. For each feedthrough assembly (300a, 300b), the physical separation between adjacent optical fiber cables provided by the cable conduits (704, 1104) and the second sealing material 510, may prevent excessive heating within the main housing 406. Due to the thermal conductivity of the second sealing material 510, heat generated in each of the optical fiber cables may be conducted from the optical fiber cables through thermal paths provided by the second sealing material 510, walls of the housings (500a, 500b, 502a, 502b), and a wall of the main housing 406. In other words, heat generated within each optical fiber cable may dissipate through thermal paths provided within the feedthrough assemblies (300a, 300b). Further, the absence of pockets of air within the feedthrough assemblies prevents the creation of hot spots that can rapidly expand and cause thermally induced operational irregularities in the testing system 100.

In addition, the feedthrough assembly 300 allows for multiple optical fiber cables to pass through a single feedthrough while maintaining extremely low lateral and axial stress on each optical fiber cable. As a result, each optical fiber cable extends along a substantially uniform straight path which may eliminate an occurrence of optical signal loss from the optical fiber cables within the feedthrough assembly 300. Another advantage provided by dedicated cable conduits for each optical fiber cable, or electrical cable in other applications, is increased efficiency in assembling a feedthrough.

Manufacturing methods such as additive manufacturing (AM) or Solid Freeform Fabrication (SFF) of metal parts can be used to fabricate an intricately shaped structure of the inner housings (500a, 500b) or the outer housings (502a, 502b). For example, a three-dimensional computer model of any of the housings (500a, 500b, 502a, 502b) can be sliced into thin cross-sections. The resulting cross-sections can be translated into two-dimensional position data that can be fed to control equipment that fabricates a three-dimensional structure in a layerwise manner. The resulting three-dimensional structure may be formed from metal, such as high oxygen free copper, a thermoplastic/polymer based material, or other material. In an application in which thermoplastic material is utilized, an AM process may include calculating a path to extrude the thermoplastic material, which is then deposited in a semi-liquid state as ultra-fine beads along an extrusion path. The material for the housings (500a, 500b, 502a, 502b) may be selected according to a desired thermal conductivity or lack of thermal resistance. Thus, components that must withstand high temperatures during an operation of a machine or apparatus in which the components are incorporated, can be produced using metal AM or SFF manufacturing techniques.

Other AM processes that may be utilized include, but are not limited to: stereolithography; photopolymerization stereolithography; mask image stereolithography; metal-sintering; selective laser sintering; direct metal laser sintering; selective laser melting; laser engineered net shaping; wire arc processes; electron beam melting; fused deposition modeling; inkjet deposition; polyjet printing; inkjet material deposition; drop-on-drop material deposition; laminated object manufacturing; subtractive manufacturing processes; combined additive and subtractive manufacturing processes; Arburg Kunststoff free forming; combinations thereof; and any other additive manufacturing processes know in the art.

In order to simplify the manufacturing of components of the feedthrough assembly 300, each of the housings (500a, 500b, 502a, 502b) may be manufactured to have an equal length, with each of the inner housings (500a, 500b) being identical, and each of the outer housings (502a, 502b) being identical. A further advantage of this manufacturing scheme is that an operator assembling the feedthrough assembly 300 will not have to make sure the right type of outer housing and the right type of inner housing are be positioned closer to the first end 408 or the second and 410 of the main housing 406. Thus, assembly of the feedthrough assembly 300 may be simplified by providing identical inner housings and identical outer housings.

However, providing different types of inner housings and outer housings may also have advantages which may include reducing amounts of materials required for assembly and overall cost of the feedthrough assembly 300. For example, the second inner housing 500b could have a tapered end with no inner central conduit, and the second outer housing 502b could also have no outer central conduit. As a result, less second sealing material 510 would be required to fill the main housing 406. In another variation, the second inner housing 500a could be provided without a tapered first end, and be identical in shape to the second outer housing 502b. In this arrangement, the second inner housing 500b and the second outer housing 502b may both be formed without a respective central conduit. It will be appreciated that other configurations may be provided that include inner and outer housings that are not identical.

It will be appreciated that the foregoing description provides examples of the disclosed system and technique. However, it is contemplated that other implementations of the disclosure may differ in detail from the foregoing examples. All references to the disclosure or examples thereof are intended to reference the particular example being discussed at that point and are not intended to imply any limitation as to the scope of the disclosure more generally. All language of distinction and disparagement with respect to certain features is intended to indicate a lack of preference for those features, but not to exclude such from the scope of the disclosure entirely unless otherwise indicated.

What is claimed is:

1. A signal conveying system comprising:
   a plurality of cables; and
   a feedthrough assembly including
     a main housing,
     at least one housing positioned within the main housing and including an internal wall that defines a plurality of conduits,
     a volume defined by an internal surface of the main housing, and
     a sealing material provided in the volume, wherein each of the plurality of cables extends through the main housing and a respective one of the plurality of conduits, wherein the sealing material and the internal wall isolate each of the plurality of cables from one another, wherein each cable includes
   a core,
   a first sleeve positioned around the core within the main housing adjacent to a first edge of a length of the cable with the core exposed, and
   a second sleeve positioned around the core within the main housing adjacent to a second edge of the length of the cable with the core exposed, wherein for each cable, the length of the cable with the core exposed includes
   a first portion isolated within the main housing by the sealing material, and
   a second portion isolated within the main housing by the internal wall and the sealing material, wherein the at least one housing includes an inner housing and an outer housing adjacent to the inner housing, wherein the plurality of conduits include inner conduits defined by the inner housing and outer conduits defined by the outer housing, wherein each inner conduit is aligned with a respective outer conduit, and wherein for each cable
   the second portion of the length of the cable with the core exposed is positioned in a respective inner conduit, and
   at least a portion of the first sleeve or the second sleeve is positioned in a respective outer conduit.

2. The signal conveying system according to claim 1, wherein
the main housing includes a first end and a second end,
the sealing material includes a first sealing material and a second sealing material different than the first sealing material,
the first sealing material seals the second end of the main housing, and
the second sealing material seals the first end of the main housing and the plurality of cables within the at least one housing.

3. The signal conveying system according to claim 2, wherein
the plurality of conduits includes a central conduit and at least one row of conduits defined around the central conduit, and
an entire volume defined by the central conduit is filled with the second sealing material.

4. The signal conveying system according to claim 1, wherein each cable is surrounded by the sealing material within the respective inner conduit and the respective outer conduit.

5. A method of conveying optical signals, the method comprising:
providing a feedthrough assembly having a housing that defines a conduit and an optical fiber cable extending through the conduit,
transmitting an optical signal through the optical fiber cable along a substantially straight path defined by the optical fiber cable that extends from a first end to a second end of the feedthrough assembly;
conducting heat from the optical fiber cable with a portion of the sealing material that fills a chamber defined by the feedthrough assembly; and
outputting the optical signal from the second end,
wherein the housing is positioned within the feedthrough assembly between the first end and the second end and supports the optical fiber cable to extend along the substantially straight path, and
wherein the optical fiber cable includes an exposed core in direct contact with a sealing material that fills the feedthrough assembly and supports the optical fiber cable to extend along the substantially straight path.

6. The method according to claim 5, further comprising:
conducting heat from the optical fiber cable with a portion of sealing material within the housing and an internal wall of the housing defining the conduit.

7. A method of conveying optical signals, the method comprising:
providing a feedthrough assembly having a housing that defines a conduit and an optical fiber cable extending through the conduit;
transmitting an optical signal through the optical fiber cable along a substantially straight path defined by the optical fiber cable that extends from a first end to a second end of the feedthrough assembly;
conducting heat from the optical fiber cable with a portion of the sealing material within the housing and an internal wall of the housing defining the conduit; and
outputting the optical signal from the second end,
wherein the housing is positioned within the feedthrough assembly between the first end and the second end and supports the optical fiber cable to extend along the substantially straight path, and
wherein the optical fiber cable includes an exposed core in direct contact with a sealing material that fills the feedthrough assembly and supports the optical fiber cable to extend along the substantially straight path.

8. The method according to claim 7, further comprising:
conducting heat from the optical fiber cable with a portion of the sealing material that fills a chamber defined by the feedthrough assembly.

\* \* \* \* \*